United States Patent [19]

Brust

[11] Patent Number: 5,281,909
[45] Date of Patent: Jan. 25, 1994

[54] PROCESS AND SYSTEM FOR MEASURING THE COURSE OF A SIGNAL AT A POINT OF MEASUREMENT ON A SAMPLE

[76] Inventor: Hans-Detlef Brust, Martin-Luther-Str. 2, D-6602 Dudweiler, Fed. Rep. of Germany

[21] Appl. No.: 499,315
[22] PCT Filed: Nov. 12, 1988
[86] PCT No.: PCT/DE88/00707
§ 371 Date: Mar. 22, 1991
§ 102(e) Date: Mar. 22, 1991
[87] PCT Pub. No.: WO89/04493
PCT Pub. Date: May 18, 1989

[30] Foreign Application Priority Data
Nov. 12, 1987 [DE] Fed. Rep. of Germany ....... 3738453

[51] Int. Cl.$^5$ ............................................ G01R 31/28
[52] U.S. Cl. .................................. 324/158 R; 324/96; 250/310
[58] Field of Search .............. 324/155 R, 158 D, 73 T, 324/71.3; 250/310, 311, 492.2; 364/550, 551.01

[56] References Cited
U.S. PATENT DOCUMENTS

| | | | |
|---|---|---|---|
| 4,220,853 | 9/1980 | Feuerbaum et al. | 324/158 D |
| 4,223,220 | 9/1980 | Feuerbaum | 324/158 D |
| 4,853,622 | 8/1989 | Brust | 324/158 R |
| 4,902,963 | 2/1990 | Brust | 324/158 R |
| 5,034,683 | 7/1991 | Takahashi et al. | 324/158 R |

OTHER PUBLICATIONS

Digital Time Intervalometer, vol. 39, No. 9, Sep. 1968, pp. 1342–1345.
Scanning Electron Microscopy/1979/1, pp.-305–318.
Electron Beam Testing, Aug. 6, 1985, pp.-77–105.
Electron Beam Testing: Methods & Applications, pp. 15–24. May 1982.

Primary Examiner—Vinh Nguyen
Attorney, Agent, or Firm—Evenson, McKeown, Edwards & Lenahan

[57] ABSTRACT

A process and a system for measuring the temporal course of a recurring signal at at least one site of, measurement of a sample, the sample being impinged upon by a primary corpuscular beam and a secondary signal being derived from the sample. The process and the system has a primary beam current that is temporally variable. There is interaction between the primary beam and the sample. At least one part of the interaction between the primary beam and the sample is registered and/or recorded. The temporal relationship between a trigger signal, which is in a defined temporal relationship with the signal course to be measured, and the course of the primary wave current is measured. The registered and/or recorded values of the secondary signals are assigned to the points in time of the signal course to be measured according to the temporal relationship measured in the preceding step of the process.

40 Claims, 5 Drawing Sheets

PROCESS AND SYSTEM FOR MEASURING THE COURSE OF A SIGNAL AT A POINT OF MEASUREMENT ON A SAMPLE

BACKGROUND AND SUMMARY OF THE INVENTION

The present invention relates to a process and a system for measuring the course of a signal at a point of measurement on a sample with the aid of a corpuscular probe.

Usually checking the functioning of high integrated circuits occurs in computer-controlled semi-conductor test systems, in so-called function testers, in which errors in the integrated circuit are recognized by means of an analysis of the voltage level measured at the outputs of the examined circuit in dependence on the input bit patterns, but can be localized only with great difficulty. For this reason, additional checks and measurements have to be conducted inside the highly integrated circuit, especially during the development phase.

Corpuscular beam measuring processes, employed in all fields of development and fabrication of micro-electronic components, have proven to be particularly suitable for this purpose, especially the electron beam testing technique. In these measuring techniques, a finely focussed corpuscular beam is aimed at the point of measurement and the secondary corpuscles, forming a derived secondary signal, and which are influenced by the course of the signal to be measured at the site of measurement, are registered. A survey of the presently utilized testing procedures In electron beam testing is found in the publication "Electron Beam Testing" by E. Wolfgang (in the periodical "Microelectronic Engineering", Vol. 4, 1986, pp. 77-106). One of the most important measuring procedures in electronic beam testing is so-called waveform measurement, which is described in detail in the publication "Electron Beam Testing: Methods and Applications" by H.P. Feuerbaum (in the periodical "Scanning", Vol. 5, pp. 14-24), especially on pages 12 to 14, and with the aid of which the voltage waveform at the point of measurement can be measured.

In waveform measurement, a finely focused electronic beam is aimed at the site to be examined in the integrated circuit. The primary electrons impinging there release secondary electrons from the surface of the sample, which are in turn influenced by the electrical potential on the surface of the sample. This influence manifests itself in a secondary electron current, which depends on the potential at the site of measurement, i.e., on an energy shift of the secondary electrons, which also is determined by the electrical potential at the site of measurement and which can be measured with the aid of an energy spectrometer. This effect is referred to as voltage contrast. As the detectors required for registering the secondary electrons usually only have a relatively small band width of a few MHz, a sampling process, in which the temporal course of the signal is sampled for a triggering event at the site of measurement like with a sampling oscilloscope with short electron pulses, must be employed in order to obtain high time resolution. As each primary electron pulse can only contain very few electrons, the sampled values of very many measuring cycles must be averaged in order to obtain a sufficient signal-to-noise ratio, which can result in very long measuring cycles. Therefore, this process is only suited for examining periodically recurring signals.

As in waveform measurement, an electron pulse is generated by the triggering event, the frequency of the triggering determining the required measuring time. For this reason, waveform measurement only yields relatively inexact results at low triggering frequencies, if overly long measuring times are not tolerated. This is extremely disadvantageous of the integrated circuit is to be operated in the same test cycle as in the function tester in order to reproduce the error, for the test cycles of the function tester are usually relatively long and, therefore, only recur with very low frequency. Moreover, only processes that occur after the triggering event can be examined. On the other hand, very often, however, it is the processes occurring prior to the triggering event that are of particular interest. This is the case, by way of illustration, if the integrated circuit is to be controlled by a semi-conductor tester and the output signal of the function tester, which indicates whether or not the component is operating properly, is to be employed as the trigger signal. The triggering event in this example would be the occurrence of an error in the operation of the integrated circuit, by way of illustration the erroneous readout of a memory cell. It is readily understandable that in this case the course of the signal at the respective measuring site prior to the triggering event, which permits drawing conclusions about the source of the error, is of particular interest. Although, in principle, the electron pulse can be generated with the trigger signal from one cycle for the next cycle and, therefore, apparently measurements can also be conducted prior to the triggering event, this, however, quite often leads to jitter problems, especially in long test cycles. Moreover, only periodically recurring processes can be examined with this procedure. On the other hand, this procedure is not successful with, often recurring processes occurring only statistically distributed. Such only statistically occurring processes can be caused in integrated slits, by way of illustration, by the impingement of particles. Furthermore, such processes often occur if the integrated circuit is driven to the limits of its capacity (so-called "marginal test") and very many factors that are very difficult to influence effect the function of the component. In all the above-described cases, conventional waveform measurement is not successful.

An object of the present invention is to provide a process and a system for measuring the course of a signal at a point of measurement, with the aid of which courses of signals only occurring with very low frequency of recurrence and, moreover, under circumstances, occurring only statistically distributed, can also be measured. Another object of the invention is to provide a system which can examine processes occurring prior to the triggering event.

SUMMARY OF THE INVENTION

These and other objects are achieved by the present invention which provides a process for measuring the temporal course of a recurring signal at at least one site of measurement of a sample. This process includes the steps of impinging the sample with a primary corpuscular beam and deriving a secondary signal from the sample. The primary beam current is temporally variable, and there is interaction between the primary beam and the sample. At least one part of the interaction between the primary beam and the sample is registered and/or recorded. The temporal relationship between a trigger signal and the course of the primary beam current is measured, there being a defined temporal relationship between the trigger signal and the signal course to be measured. The registered and/or recorded values of the secondary signal are assigned to the points in time of the signal course to be measured according to the measured temporal relationship.

The objects of the invention are also achieved by a system for measuring the temporal course of a recurring signal at at least one site of measurement of a sample in a microscope by an instrument for guiding and focusing an primary corpuscular beam and a sample that is supplied with supply voltages and/or signals by a drive unit. The system comprises a primary beam source for generating a modulated primary corpuscular beam, means for measuring the temporal relationship between a trigger signal and the course of the primary corpuscular current, and a measured value processing system for registering and/or recording and/or assessing the values of a secondary signal produced by the interaction between the primary beam and the sample.

An advantage gained with the present invention lies, in particular, in the fact that even the course of signals of processes, which only occur with a low recurrence rate, can be measured with high precision if the process to be examined does not recur periodically, but only statistically distributed. By this means, coupling a function tested with an electron beam testing device is much simplified and the comparison of the measured, i.e., test, results from both devices is facilitated, which contributes considerably to more rapid and very effective error detection.

Other objects, advantages and novel features of the present invention will become apparent from the following detailed description of the invention when considered in conjunction with the accompanying drawings.

DETAILED DESCRIPTION OF THE DRAWINGS

Although the following preferred embodiments relate to an electron beam testing device, the present invention is intended to be understood in such a manner that ions or other corpuscles may be used instead of electrons, both as primary and as secondary corpuscles.

Figure 1:
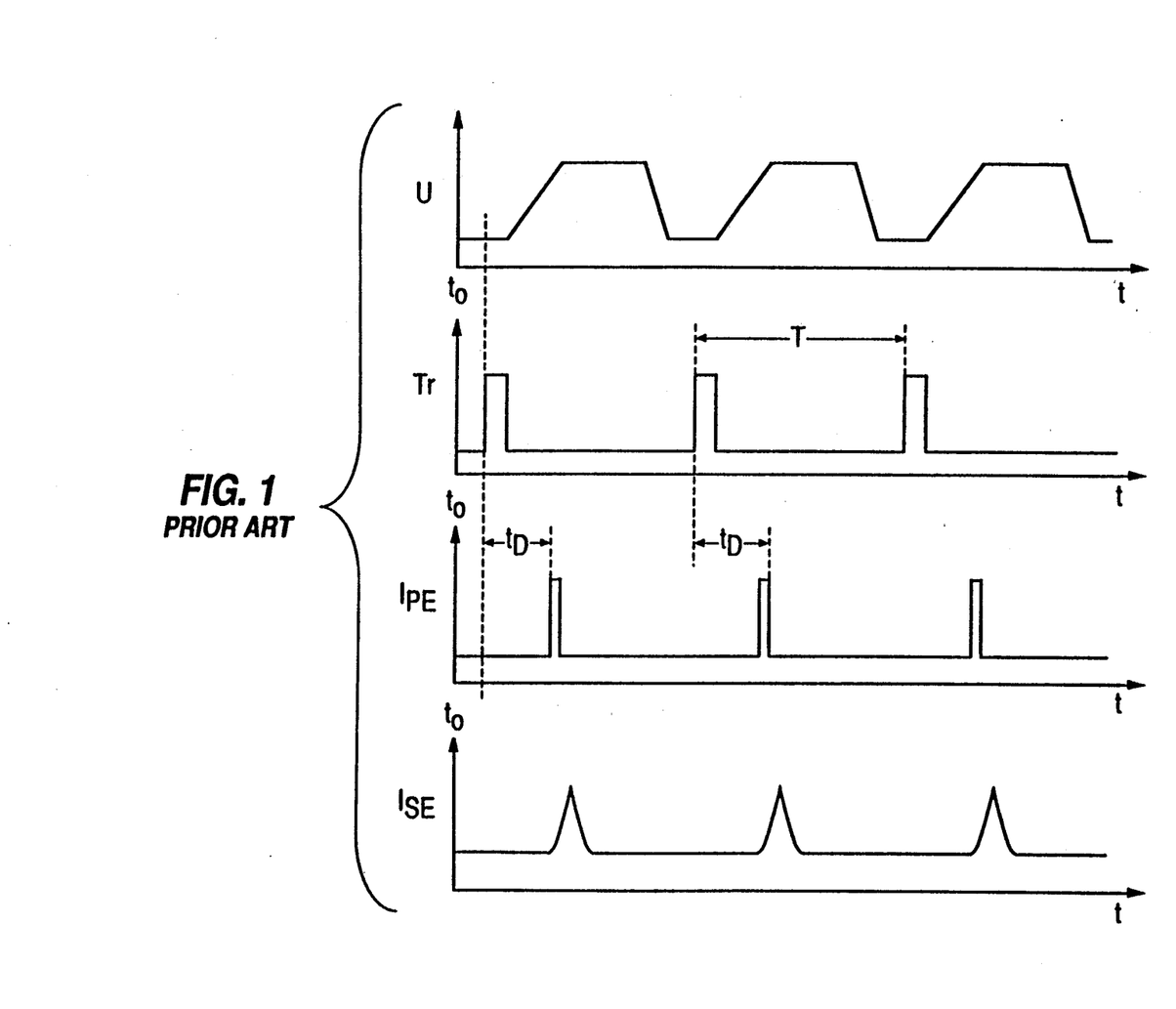
FIG. 1 shows the operating principle of the conventional process of the waveform measurement according to the state of the art.

FIG. 1 illustrates the operating principle of conventional waveform measurement according to the state of the art, as it is described, by way of illustration, in the above-cited publication by H. P. Feuerbaum. The signal course U to be measured recurs periodically with a duration period T. In order to do this measuring, a trigger signal Tr that initiates and indicates the process to be measured must be generated in the sample to be examined or in its drive unit. As a consequence of a such a trigger impulse, a primary electron pulse is generated following a delay time of $t_D$ which leads to a pulse-formed primary electron current $I_{pE}$. Each primary electron pulse generates a secondary electron pulse so that a corresponding pulse-formed secondary electron current $I_{sE}$ is the result. The small shift in time between the primary and secondary electron pulses is due to the transit time of the electrons between the electron source and the sample, and/or between the sample and the detector. The achievable time resolution is determined in the process solely by the width of the primary electron pulse, and not by the band width of the detection system, with which the secondary electron current is registered. By slowly shifting the point in time, at which a primary electron pulse is generated and thereby the course of the signal is sampled, thus by varying the delay time $t_D$, of the entire signal course that is of interest can be scanned. The speed, with which the time delay $t_D$ is altered determines how many sampled values and measuring cycles are averaged per point in time. As can be distinctly seen, the signal-to-noise ratio is relatively unfavorable, as the primary electron beam is nearly constantly blanked and, therefore, only a small fraction of the maximum possible primary electron current reaches the sample. The greater the duration period T, the worse is the signal-to-noise ratio, which either results in longer measuring times or to less measurement precision. Moreover, the primary electron pulses, which induce the sampling of the signal course, are not released until the trigger impulse does so and consequently do not occur until after the trigger impulse. Measurements prior to the trigger impulse, therefore, cannot be performed.

Figure 2:
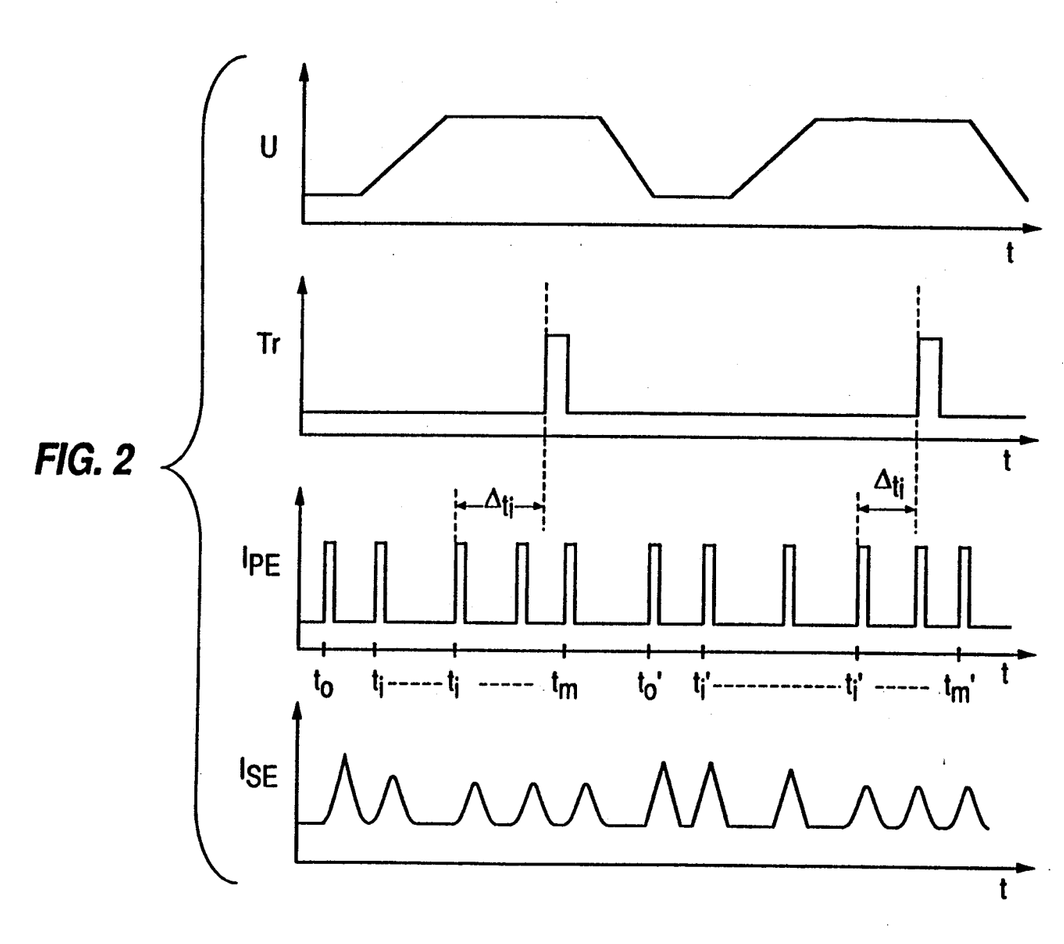
FIG. 2 shows the operating principle of an embodiment of the process of the present invention for measuring the course of a signal at a site measurement.

FIG. 2 shows the operating principle of the process of an embodiment of the present invention, which does not have the disadvantages described above. Like in the conventional measuring processes of waveform measurement, in the process of the present invention, a primary electron beam is also aimed at the sample and the presence of the process of interest is also indicated by a trigger signal Tr. In contrast to the conventional sampling process, the trigger impulse does not have to indicate the commencement of the process to be measured, but rather the trigger impulse may occur at random prior to, during or following the process to be measured. The primary electron pulses are generated completely independently of the signal course to be measured and of the trigger impulse. The time function over which this occurs, thus what the temporal course of primary electron current $I_{pE}$ looks like, is in principle random, yet it is advantageous if this time function, in FIG. 2 the sampled points in time $t_0, t_1, \ldots, t_m$, is known. The secondary electron pulses generated by the primary electron pulses are detected and the corresponding current values are stored. In order to be able to assign the sampled values registered in this manner correctly to their temporal positions in the signal course U to be measured in assessing the measurement, the temporal position of the trigger impulse to the time function of the primary electron current $I_{pE}$ is measured. If the time function of the primary electron current $I_{pE}$ is known, it suffices, by way of illustration, as shown in FIG. 2, to measure the time interval between the trigger impulse and the next primary electron pulse.

The temporal position of the other sampled values in reference to the signal course to be measured can then be easily calculated from the known time function of the primary electron current $I_{pE}$, as the points in time $t_0$, $t_1 \ldots t_m$ and therewith the temporal position of the sampled values in reference to the reference values $t_i$, respectively $t'$ are known. The temporal position in reference to the signal course ("time-domain waveform") to be measured is thus obtained simply by subtracting the measured time differences t, respectively $t'$, between the trigger impulse and the reference point $t_i$, respectively $t_i'$. On the other hand, if the time function of the primary electron current is unknown, the time interval of each individual primary electron pulse to the trigger signal must be measured and stored together with each respective sampled value. With a known time function, however, it suffices to only measure a single time difference t, respectively $t'$ for an entire group of sampled values and store it with the corresponding group of measured values. This is, of course, substantially easier and requires much less effort. For assessing the measurement, the temporal position of each sampled value is calculated with the aid of the stored time difference (t, t') in reference to the course of time of the signal U to be measured and subsequently the sampled value is used to determine the signal value at this point in time. Since several sampled values usually occur at one point in time of the signal course ("time-domain waveform") U, an average is made, which improves the signal-to-noise ratio.

As known by those of ordinary skill in the art, the "voltage waveform U", the "signal course U", and the "temporal course" refer to varying values of a time-dependent signal which is measured. For example, it is a function of time, such as V(t), wherein V is the potential.

As can be directly seen from FIG. 2, not one, but many samplings of the signal course U are performed per triggering event. For this reason, the process of the present invention yields a substantially better signal-to-noise ratio for the same measuring time and, therefore, greater measuring precision than conventional waveform measurement. Thus, this process can be usefully employed even with very low trigger frequencies, the signal-to-noise ratio being better the closer together the primary electron pulses lie. As the secondary electron detector has to be able to separate the individual secondary electron pulses, the band width of the detection system used determines the minimal time interval between two primary electron pulses. As the generation of primary electron pulses occurs independent of a triggering event, samplings are always conducted prior to the trigger impulse. For this reason, the temporal position of the trigger impulse in reference to the process to be measured is irrelevant as long as this temporal position is constant. Since the measurement of the time differences can be performed with very high precision and time resolution, the triggering event can occur even very late after the process to be measured. In this manner, by way of illustration, a signal course in the ns-range can be measured with the process of the present invention although the trigger signal does not occur until several ms after the process to be measured. With conventional waveform measurement, on the other hand, such measuring would be practically impossible. If the measuring according to the process is performed over very many cycles, every point in time of the signal course U is sampled the number of times on the average due to being independent from the signal course to be measured and from the primary electron current. A phase shift and/or a change in the delay time $t_D$ like in conventional waveform measurement is not required.

Thus, a fundamental concept of the process of the present invention is generating primary electron pulses, following an arbitrary time function, which may be totally independent of the sample and the process to be examined there. The respective values of the secondary electron current, respectively a corresponding secondary signal are registered, and a temporal reference between the registered measured values and the process to be examined is established by measuring the time interval between the time function of the primary electron current and a trigger signal, which is in a defined temporal reference to the process to be examined.

Figure 3:
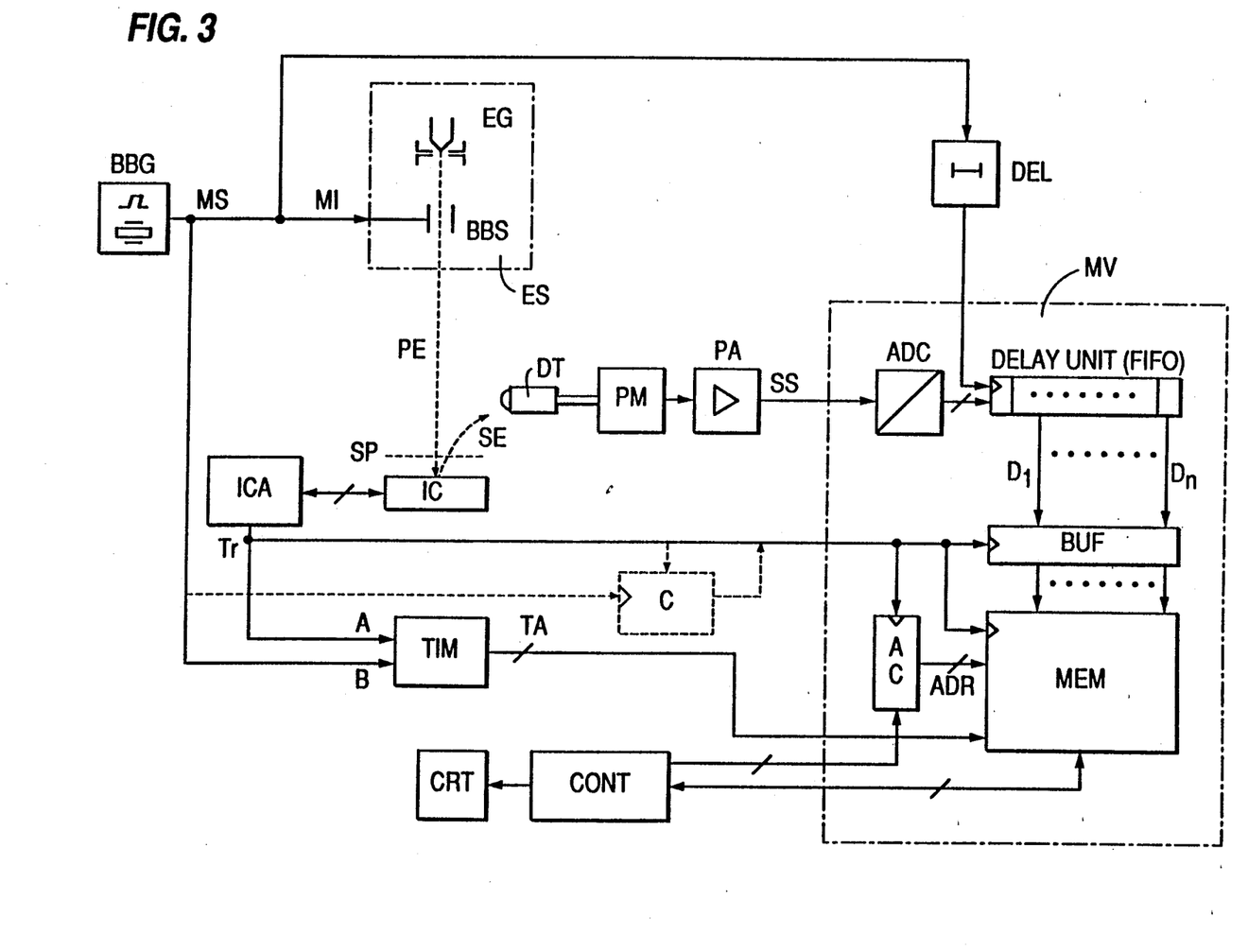
FIG. 3 shows a according to the present invention system for performing the process of the present invention.

FIG. 3 schematically depicts an embodiment of a system with which the process of the present invention is realized. A major unit of this system is a prior art electron beam testing device known, by way of illustration, from U.S. Pat. Nos. 4,220,853 and 4,223,220. A finely bundled primary electron beam PE is generated in the electron optical column of such an electron beam testing device. This electron optical column is provided, in addition to a great number of apertures and electric or magnetic lens systems for forming, deflecting and focussing the beam, that are not depicted in FIG. 3 and the subsequent figures for reasons of clarity, with an electron source ES.

The task of the electron source ES is to generate the primary electron pulses. In FIG. 3, the electron source ES includes an electron gun EG comprising a cathode, which generates the primary electrons by thermal emission, an anode and a Wehnelt electrode, and with a beam modulation or blanking system BBS. With the aid of the beam modulation system BBS, the continuous primary electron current delivered by the cathode is modulated in its intensity. In this manner, primary electron pulses can be generated. Possible versions of the electron gun EG and of the beam modulation system BBS are described, by way of illustration, in the publication "Electron Beam Chopping Systems in the SEM" by E. Menzel and E. Kubalek Scanning Electron Microscopy; SEM Inc., AMF O'Hare, 1979/I, pp. 305–317).

In order to generate the primary electron pulses, a beam modulation generator BBG is connected to the modulation input MI of the electron source ES. The beam modulation generator BBG controls the beam modulation system BBS with a modulation signal MS. In this realization, the modulation signal MS consists of square pulses, which occur with a constant frequency of recurrence. Other possible ways of controlling the beam modulation system with various signal forms are also described in the above-cited publication by E. Menzel and E. Kubalek and can be employed in principle. Each square pulse of the modulation signal MS briefly keys the primary electron beam PE and generates, in this manner, a primary electron pulse. The width of the square pulse determines the duration of the primary electron pulse. As the primary electron pulses succeed one another periodically by the time interval T", the time function of the primary electron current is known, which simplifies assessing the measuring results later. Since in this case the constancy of the duration period T", with which the primary electron pulses are generated decisively determines the precision of the measurement, the beam modulation generator, which generates the modulation signal MS, should have a high frequency stability. The easiest way to achieve this is if the generator BBG is quartz-crystal-stabilized or for its part triggered by a high constant time base.

The primary electron pulses generated in this manner are then focused by the lens systems (not depicted in FIG. 3) onto the sample IC, by way of illustration an integrated circuit. There the impinging primary electrons PE release the secondary electrons SE, which are registered by a detector DT and converted into light pulses. These light pulses are subsequently guided via a light guide to a photo-multiplier PM, which is usually situated outside the vacuum chamber of the electron beam testing device and which converts the light pulses back into an electric signal. After additional amplifying in a pre-amplifier PA connected after the photomultiplier PM, this electric signal is available as a (in this case an electric) secondary signal SS for further assessing in a measured value processing system MV. As the secondary electrons SE are influenced by the electrical potential at the site of measurement, the secondary signal SS is also determined by the potential at the site of measurement and, in this manner, by the voltage waveform U to be measured.

The sample IC to be examined is operated cyclically in order to reproduce the process of interest, e.g. an error. For this purpose, the sample IC is supplied with supply voltages and, if need be, with input signals for stimulation by a drive unit ICA. A function tester, which monitors and thereby can determine if the sample IC is operating properly or not, can, in particular, serve as the drive unit ICA. The triggering or the sample itself also delivers the trigger signal Tr, which indicates that the process to be examined is occurring or has occurred, in the sample. The fail signal of a function tester, which indicates that the sample IC is operating improperly, can, in particular, serve as the trigger signal. The time difference between the trigger signal are the next primary electron pulse is measured in order to determine the temporal relationship between this process and the time function of the primary electron current.

As the primary electron pulses are generated with constant frequency of recurrence, a single time measurement suffices for determining the temporal position of an entire series of measured values of the secondary signal SS with reference to the voltage waveform to be measured. A time intervalometer TIM, to which both the trigger signal Tr and the modulation signal MS are transmitted, is used for measuring the time difference. For example, to frequency counter 1995 from the firm Racal-Dana can be employed in Time-Interval (A→>B)- Modus as a time intervalometer. Another time intervalometer is described in the publication "Digital Time Intervalometer" by R. Nutt (Review Scientific Instruments, Vol. 39, 1968, pp. 1342-1345). The triggering signal Tr at the input A starts the time interval measurement, the next square pulse from the modulation signal MS at input B, amounting to a new primary electron pulse, stops it. The measuring result TA of the time intervalometer obtained in this manner first indicates the temporal position of the next primary electron pulse or of the corresponding value of the secondary signal with respect to the trigger pulse Tr and, thus, the voltage waveform U to be measured. Due to the constant time interval T" of the primary electron pulses to one another, however, the temporal position of the remaining primary electron pulses and their corresponding measured values of the secondary signal can be easily calculated from it in reference to the process to be examined. It is simply yielded by adding or subtracting the corresponding multiple of T" to or from the result TA of the time measurement. The result of the time interval measurement TA is also transmitted preferably digitized, into the measured value processing system MV and recorded together with the respective registered measured values of the secondary signal SS.

The measured value processing system MV has the task of registering the respective values of the secondary signal SS of each individual primary electron pulse, if need be to delay and, if the triggering event occurs, to record together with the respective result TA of the time interval measurement. For this purpose, the measured value processing system MV contains an analog-digital converter ADC, a shift register SR, a rapid buffer circuit BUF, an address counter AC and a memory unit MEM. The analog-digital converter ADC is connected to the output of the pre-amplifier PA and converts the secondary signal SS into digital values. In view of the relatively high frequency of recurrence of the primary electron pulses there is only little time for the analog-digital conversion. For this reason, it is recommended to employ rapid types of A/D converters, by way of illustration a flash A/D converter. The simplest case is when the analog-digital converter ADC only consists of a rapid comparator as a 1-bit-A/D converter.

The digital output signal of the analog-digital converter ADC is then read into a rapid shift register SR. For this purpose, the output of the analog-digital converter is connected to the input, or inputs, of the shift register SR. As soon as a new measured value of the secondary signal must be registered, the preceding measured value is moved one memory site further in the shift register. For this, the clock input of the shift register SR is supplied with the, if need be delayed, modulation signal MS. A delay can be brought about by a delay element arranged before the clock input of the shift register. This delay is usually necessary in order to compensate for the transit time of the primary electrons PE between the beam modulation system BBS and the sample IC and the transit time of the secondary electrons SE from the sample IC to the detector and possible delay times of the signal chain, composed of the detector DT, the photo-multiplier PM and the pre-amplifier PA, and the A/D converter. The delay time of the delay element DEL is selected, for this purpose, in such a manner that it just corresponds to these transit or delay times. By this means, the shift register SR always receives the value of the secondary signal at the right point in time. Depending on the type of analog-digital converter ADC used, the modulation signal MS (which can be delayed) must also be transmitted to it so that the converter ADC conducts an A/D conversion at the right point in time.

The last N memory cells of the shift register SR are connected via a rapid buffer circuit BUF to the memory unit MEM. To the buffer circuit is also transmitted the trigger signal TR. When a trigger impulse occurs, the buffer circuit receives the contents D1, ..., DN of the last N memory cells and delivers them to the memory unit. If the buffer circuit has its own intermediate memory, the measured values, which were in the last N memory cells of the shift register. Are quasi "frozen" and the memory unit MEM has sufficient time, namely until the next trigger signal, to receive the measured values. The memory unit, therefore, does not require rapid access time and can, therefore, be realized relatively inexpensively. The respective value of the time measurement is also stored in the memory unit simultaneously with the measured values. The address under which the measured value and the time measured value TA are stored is determined by the address signal ADR, which generates an address counter AC, transmitted to the memory. As the address counter has to be incremented or decremented with each trigger signal, the trigger signal Tr is transmitted to its clock input.

As the shift register SR contains the measured values of the secondary signals prior to the arrival of the trigger impulse in the last memory cells, processes occurring prior to the trigger impulse can be examined without difficulty with this system. It is of no significance whether the trigger impulse arrives periodically, as only the recording of the measured values, but not their registration, is coupled to the trigger signal. The length of the shift register determines how far can be looked into the "past". In order to increase this time, additional delay elements, by way of illustration in the form of FIFO memories (first in first out) or CCD elements (charge coupled devices), can be arranged in also between, or before the analog-digital converter ADC. The construction and performance of such components are known to the expert in the field.

The entire system is controlled and monitored by a control unit CONT, preferably a computer. This control unit CONT is, in particular, connected to the address counter AC and the memory MEM. It can control the output signal ADR of the address counter and thereby the contents of the memory unit MEM, and thus read out all the recorded measured values of the secondary signal SS and the respective time measured values. In order to assess the measuring, the control unit CONT also has the task of assigning, on the basis of the measured time difference, the individually registered measured values to the corresponding points in time of the signal course U to be measured. If several measured values fall on one point in time, the control unit CONT can average them. If the circuit IC to be examined and the beam modulation generator BBG operate statistically independent of each other, the measured values are evenly distributed over the time axis of interest of the voltage waveform U to be measured so that the averaging can be simply performed by adding the measured values. The control unit CONT can subsequently represent the measuring results gained in this manner on an output device CRT, by way of illustration a screen or a plotter.

If not only measured values prior to the triggering event, but also some following it are to be obtained, the transfer of the memory contents from the shift register SR to the buffer circuit BUF, or the memory unit MEM, has to occur delayed in relation to the trigger impulse. This delay can, for example, ensue by means of a counter C, which can be preselected, to the clock input of which the modulation signal is transmitted and which is released by the trigger signal. After the preselected maximum counter position K is reached and thereby delayed the corresponding time K*T", the transfer of the measured values of the secondary signals SS into the memory MEM then takes place. By altering the preseleclable maximum counter position K, the examined time period can be shifted at random in steps of T" before and after the triggering event. This modification of the system in FIG. 3 is depicted with dashes.

With the above-described system, N measured values can be received per trigger signal and subsequently assessed. Correspondingly, the signal-to-noise ratio of the measuring results is better by the-factor N than in a conventional process according to the state of the art, which, moreover, would not be able to measure any occurrences prior to the trigger impulse.

Figure 4:
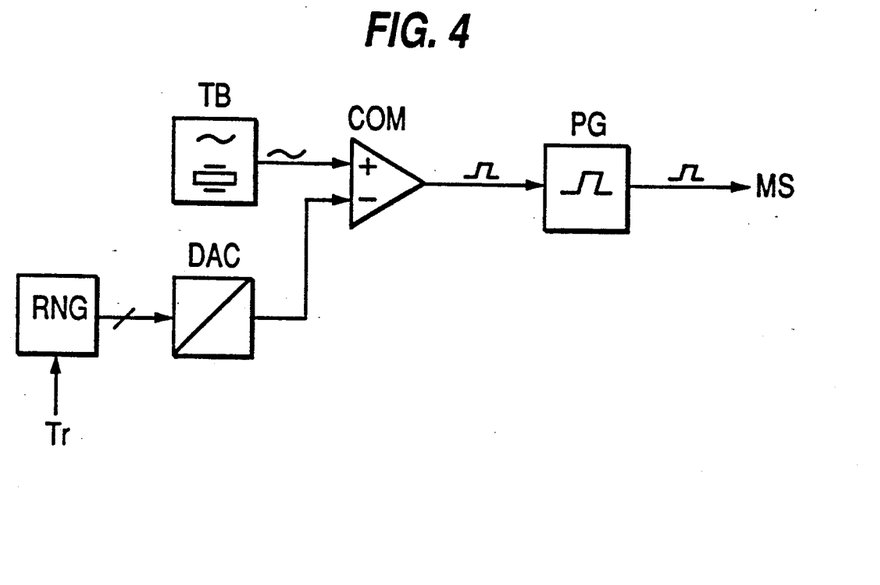
FIG. 4 shows a beam blanking generator used in the system according to 3.

The process of the present invention operates especially well when the modulation of the primary electron current and the process to be measured occur in the sample statistically independent of one another. In most cases this condition is met a priori. However, if this should not be the, case. And both processes should occur about phase synchronously then a statistical independence can be artificially established by artificially "jittering" the modulation signal MS, thus, the output signal of the beam modulation generator BBG. An embodiment of the beam modulation generator BBG suited for this purpose is shown in FIG. 4, comprising a time base TB, which generates a sine signal, which ought to be correlated to the process to be examined. This sine signal is transmitted to the comparator COM via its first input. The comparator generates from this sine signal a square signal of the same frequency, the precise temporal course of which depends on the threshold of response of the comparator COM. The threshold of response is determined by the voltage applied to the second input of the comparator. If this threshold is altered at random, the result is a "jittered" square signal at the output of the comparator COM, thus a signal, the phase of which changes at random statistically. The statistically random variation of the threshold of response can be simply obtained by connecting the output of a digital analog converter DAC to the second input of the comparator COM and the digital input of the digital-analog converter DAC to the output of a digital random number generator RNG. Construction and performance of such digital random generators are familiar to one of ordinary skill in the art from the literature. Especially advantageous with regard to the even distribution of the phase values is the use of a random number generator, which generates random numbers distributed inverse-sinusoidally. The random number generator RNG delivers random numbers continuously, which the digital-analog converter DAC converts into corresponding voltage values, which then bring about a corresponding phase shift of the output signal via the comparator COM. Switching between two random numbers should occur between the individual measurements so that the constant time interval of the primary electron pulses is upheld during an individual partial measurement. Therefore, switching to the next random number should appropriately be brought about by the trigger signal Tr, which is transmitted for this purpose to an input of the random number generator RNG. As a change in the threshold value of the comparator COM not only effects the phase of the output signal but also its pulse duty factor, the output signal of the comparator cannot be directly employed as a modulation signal MS, but a pulse generator PG, which is triggered by the output signal of the comparator, that has to be arranged after the comparator COM. The output of the pulse generator subsequently delivers the desired modulation signal MS, the pulse width of which or its pulse duty factor, can be set at the pulse generator PG.

There are other contemplated embodiments of the electron source ES besides the one shown in FIG. 3.

Figure 5:
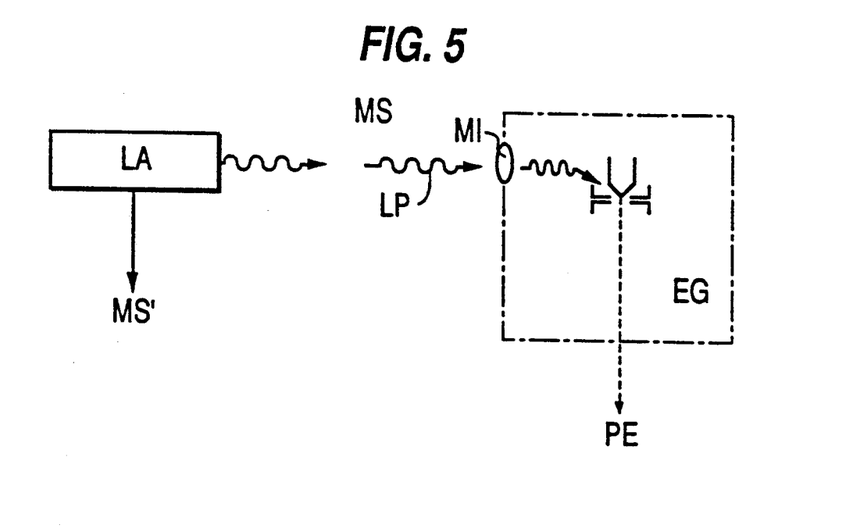
FIG. 5 shows an embodiment of the electron source utilized in the system according to FIG. 3.

For example, the heated cathode, which generates primary electrons PE by means of thermal emission, can be replaced by a field emission cathode. Moreover, a semi-conductor cathode may be employed just as well. In the semi-conductor cathode, the intensity of the emission can occur very simply by varying the cathode current. An independent beam modulation system can then be dispensed with, and the modulation signal MS controls the cathode current directly. Another possible construction of the electron source is schematically shown in FIG. 5. In this case, the primary electrons PE are generated by photo-emission from a photocathode PK. For this purpose, a pulse laser LA delivers brief light impulses, which are focused via a lens system, which is not depicted in FIG. 5 for reasons of clarity, through an optical window MI onto the photo-cathode PK, which is in the vacuum, and from which the photocathode PK releases short PE pulses by means of photo emission. In this case too, a beam modulation system may be dispensed with as the generation of PE ensues in a modulated manner. The modulation input MI is in this case not an electrical, but an optical input and the modulation signal MS is an optical signal as well, as it is formed by the light pulses emitted from the laser LA. An electrical signal MS' synchronized with it can in this embodiment be transmitted to the time intervalometer TIM and to the remaining measuring system, in particular to the measured value processing system MV. Such a signal MS' can, by way of illustration, be obtained from the laser LA. In addition, the light pulse of the laser LA can be partially guided via a divider mirror to a rapid photodiode and whose output signal, which corresponds to the modulation of the signal MS, can be utilized as a signal MS'.

The construction of the electron source ES is especially simple if the primary electron pulses are generated with a constant time interval. The modulation of the primary electron beam PE and the beam modulation system BBS can then be tuned to the frequency of recurrence of the primary electron pulses or to a multiple of the frequency or to a part of it. This represents a considerable advantage over the conventional processes, in which the beam modulation system has to be designed with a very wide band width. Narrow-band systems usually have substantially greater efficiency. In this manner, very short primary electron impulses can be generated, by way of illustration, with a kind of cavity resonator with a constant frequency of recurrence. Such a system is, described in the above-cited publication by E. Menzel and E. Kubalek. Even if a conventional beam modulation system composed of a parallel plate condenser with a blanking aperture arranged behind it were employed, the narrow-band triggering of the beam modulation system can be utilized by providing this condenser with an additional coil and tuning the resulting resonance circuit to the desired frequency. Such a system can be easily triggered with a sine signal at the resonance frequency. The voltage culmination in the resonance circuit ensures especially high blanking sensitivity and also permits generating very brief primary electron pulses, the duration of which can be determined by the amplitude of the sine voltage applied.

The assessment of the registered measured values is also facilitated considerably, if the primary electron pulses are generated periodically with constant time intervals.

Usually the assessment conducted by the control unit CONT occurs in such a manner that the time window, in which the voltage waveform U is to be measured, is subdivided in M equidistant periods of time and all the measured values of the secondary signals SS, whose respective measuring time point determined from the measured value of the time interval TA falls in the corresponding period of time, are averaged, whereby the various averaging algorithms, such as, e.g. exponential averaging, known to one of ordinary skill in the art can be applied. This assessment is not very complicated, but rather elaborate due to the great number of measured values of the secondary signals. However, this assessment can be simplified by a somewhat modified measured value processing system and thereby quickened. This is especially the case if the primary electron pulses are generated with a constant frequency of recurrence. A relatively simple alternation of the system depicted in FIG. 3 suffices for this to be achieved. This advantageous modification of the present invention, however, requires a memory MEM with a larger memory content that the one in FIG. 3. In this embodiment of the present invention, the address signals ADR delivered by the address counter AC determine only part of the memory address, e.g. only the highest grade bits of the address. The remaining ones, in the given example the lowest grade bits of the address, on the other hand, are formed by the digitized output signal TA of the time interval measurment. By this means, the position of the measuring in the memory following measurement corresponds to their temporal occurrence and the control unit CONT no longer needs to sort the measured values temporally in order to assess the measurement, but rather it suffices if it only averages all the memory contents of the memory cells with the same address parts determined by the results of the time intervalometer. Of course, with this method, the measured values of the time interval do not need to be explicitly stored away.

Figure 6:
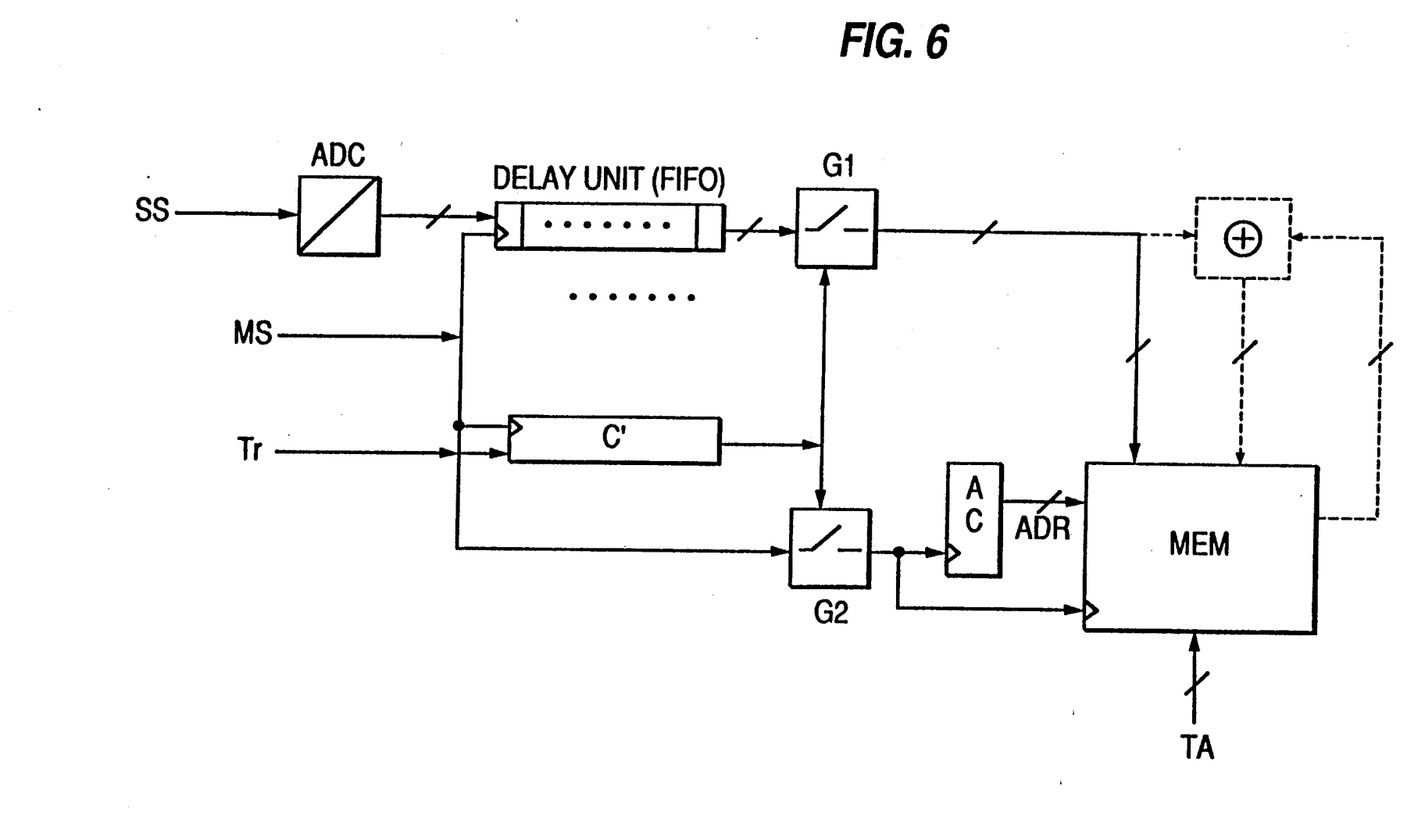
FIG. 6 shows an embodiment of the signal processing system from the system of FIG. 3.

Another embodiment of the measured value processing system is shown in FIG. 6. In this system, the respective measured values of a triggering event are not read into the memory parallel as in FIG. 3, but serially, which requires a less elaborate apparatus, but under circumstances, a memory with more faster access time instead. The measured value processing system contains, in addition to the parts mentioned in FIG. 3, also a counter C' and two gate circuits G1 and G2, which in the simplest case are designed as a gating as well as, if need be, an adder. In this system too, after the analog-digital converter ADC, which digitizes the secondary signal SS, is arranged a shift register SR' is arranged, which in this case only acts as a delay element, and is necessary in order to be able to measure the voltage necessary, the shift register SR' can be dispensed with completely. Otherwise, other realizations of a delay element (CCD elements, FIFO memory, etc) may be put in its place. The shift register SR' is connected via a gate circuit G1 to the signal input of the memory unit MEM, the addresses of which are determined by the output signals ADR of the address counter AC, as well as (if necessary) as previously described for the system in FIG. 3, by the digitized output signal TA of the time intervalometer. The delayed modulation signal MS or MS', is transmitted to the counter C' via its clock input. Moreover, it contains the trigger signal Tr as a release signal. The counter C' is a preselection counter, which counts the cycle pulses up to a pre-selectable number N after clearance by the trigger signal and then stops. An output of counter C' is connected to the control inputs of the gate circuits G1 and G2. If the counter is in the process of counting, it opens both gate circuits via these connections, otherwise the gate circuits block. As long as no trigger signal occurs, the respective measured values of the secondary signals of the individual primary electron pulses are registered and pushed through the shift register SR', but not subsequently switched through via the gate circuit G1 to the memory unit MEM and recorded there. The gate circuits G1 and G2 are not opened via the output of counter C' until the counter C' is no longer inhibited by the appearance of a trigger signal, so that now the next N measured values appearing at the output of the shift register SR' reach the memory unit MEM and are stored there. The modulation signal MS or MS', reaches the clock input of the address counter via the opened gate circuit G2. The address counter is incremented or decremented by this means with each new measured value so that consecutive measured values are stored away in different memory cells. Following N cycles of the modulation signals MS or MS', and thus N measured values of the secondary signals the counter C' stops once more and returns to a quiescent state, whereby it closes both gates G1 and G2 again and thereby prevents any further incrementing or decrementing of the address counter and further storing of measured values.

Similar to the manner previously explained in connection with the measured value processing system in FIG. 3, in this system too the digitized output signal TA from the time intervalometer TIM can be employed to address the memory unit in order to facilitate assessment. If this is done, the averaging can be carried out by the measured values processing system MV itself, so that the control unit is relieved. Moreover, in this manner the averaging can be simply carried out during the measuring itself and no additional calculating time is required. For this purpose, an adder, the inputs of which are connected one to the output of the gate circuit G1 and the other to the data output of the memory unit, is arranged between the gate circuit G1 and the memory unit MEM. The output of the adder ADD, on the other hand, is switched to the data input of the memory unit MEM. As already previously described, the gate circuits G1 and G2 are opened when the trigger impulse arrives and the measured values of the secondary signals reach the input of the adder ADD. At the same time, the memory unit MEM is addressed via the address counter AC and, if need be, in addition via the digitized output signal TA from the time intervalometer TIM, and the pertinent memory content, which indicates the sum total of the hitherto present measured values assigned to the corresponding point in time of the voltage waveform U to be measured or more generally an average of the measured values, is read out and transmitted to the second input of the adder ADD. The adder ADD subsequently adds the newly arrived measured value to the others and again reads the result of the addition into the memory unit MEM, where it then is stored under the same address.

Sometimes the to be examined samples IC only tolerate a low charge of primary beam PE. In such samples, therefore, the number of primary electron impulses reaching the sample should be kept as small as possible. For this purpose, the generation of primary electron impulses or their transfer to sample IC may be limited to a selectable time window, the position of which is defined in reference to the trigger signal TR. In practice, this can be achieved by arranging a gate circuit before the modulation input MI, which can block the modulation signal. In the system in FIG. 3, it may be, by way of illustration, a PIN-diode switch, in the system in FIG. 4 a Pockels cell. If the beam modulation generator BBG or the pulse generator PG has a "gated" type operation, the gate input of the generator can be triggered instead of an additional gate circuit. If, by way of illustration, only the voltage waveform U following the trigger signal is of interest, the gate circuit, or the beam modulation generator BBG can be switched open only for the period of t-me of interest by the monoflop circuit triggered by the trigger signal Tr. This cannot be applied, however, if processes prior to the triggering event are to be measured. However, if it is known that the signal course U to be measured can only occur with a maximum frequency of recurrence, the gate circuit or the beam modulation generator BBG, again triggered by the trigger signal Tr, can be blocked for a specific time interval (which should be less than the minimal duration period of the signal course U to be measured) following the arrival of the trigger impulse, thereby avoiding unnecessary charging of the sample.

Although the process of the present invention has so far only been described for waveform measurement, in which the primary electron beam is positioned only on one single site of measurement, it may, in principle, be utilized in all measuring techniques using a stroboscope or sampling process. In the field of electron beam testing, the processes logic state mapping and "timing diagram" may be cited, for example. In these processes, the primary beam PE scans over single points, a line or a part of the surface of the sample and is not only aimed steadily at one point. If the process of the present invention is to be applied here, site data on the location, from where the measured values originate, must also be recorded for each trigger impulse in addition to the measured values of the secondary signal SS and the result TA of the time interval measurement. How such site data is obtained in an electron beam testing device, be it in the form of deflecting voltage from a scanning generator, is known to the expert in the field. When the measurements are subsequently assessed, each individual measurement can be unambiguously assigned to a specific site of measurement from the stored site data. In this case too an average should be made if several measured values are recorded at the same time at the same site. How the primary beam PE moves over the sample during measuring and in what sequence, for example, the individual sites of measurement were scanned is completely without significance. Moreover, the movement of the primary beam PE does not necessarily have to be coupled to the measurement.

If the process to be examined occurs periodically and with high frequency of recurrence, the number of trigger impulses required for a measurement and therefore also the number of necessary time interval measurements can be considerably reduced by measuring the duration period of the process to be examined, e.g. with the aid of a frequency counter, with greater precision. In that manner, very many measured values of the secondary signal SS can be registered and recorded per triggering event over several periods of the process to be examined. Even if these measured values come from different periods of the process to be examined, they can be unambiguously assigned to the various points in time of the voltage waveform U on the basis of the measured value TA of the time interval measurement and the also measured duration period of the process to be measured. This embodiment of the present invention is particularly advantageous if the trigger impulses come in much more rapid succession than the time intervalometer TIM can measure and/or if the duration period of the process to be examined is shorter than the time interval T" of the primary electron pulses.

Other interactions of the primary beam and the sample may also be utilized instead of the potential contrast effect, on which the description of the process of the present invention and the system of the invention, is based. Among them is, by way of illustration, the influence of a magnetic field on the secondary electrons SE generated by a primary beam PE. Exploiting this so-called "magnetic contrast", would permit examining, for example, the movement of magnetic domains in the magnet bubble memories. Furthermore, the secondary signal SS by no mean has to emanate from a secondary electron current, which is measured with the aid of a detector DT. The secondary signal by way of illustration, can be derived from the sample IC by, e.g., measuring the current induced into the sample by the primary beam PE at the connections of the sample. An example of such a technique, in which the invented process can also be employed, is the EBIC (electron beam induced current) technique well-known to one of ordinary skill in the art.

For gaining the secondary signal SS, a spectrometer SP, in particular, can be placed in the system Especially suited is a retarding field spectrometer as is known by way of illustration from the U.S. Pat. No. 4,292,419. How such a spectrometer can be used to obtain a signal is known to one of ordinary skill in the art. A particularly simple possibility is, e.g. applying a constant voltage to the retarding field grid.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A process for measuring the varying values over time of a recurring signal at at least one site of measurement of a sample comprising:
   a) impinging the sample with a primary corpuscular beama that has a primary beam current which is temporally variable, there being an interaction between said primary beam and said sample,
   b) registering at least one part of said interaction between said primary beam and said sample, said part being values of a secondary signal generated from the sample by said interaction, such that the values of the secondary signal are registered;
   c) measuring the temporal relationship between a trigger signal, which is in a defined temporal relationship with the varying values over time of the signal to be measured, and the course of said primary beam current, and
   d) assigning the registered values of said secondary signal to the temporal positions of said varying values over time of the signal to be measured according to said measured temporal relationship.

2. A process according to claim 1, wherein the primary beam current is formed from individual primary beam pulses and at least one group of said primary beam pulses has a constant time interval, and the measuring of said temporal relationship includes the step of e) measuring the duration of the time interval between the occurrence of said trigger signal and at least one point in time, at which a primary beam pulse is generated.

3. A process according to claim 2, wherein said steps a)-d) are performed several times.

4. A process according to claim 3, further comprising averaging a plurality of registered values of said secondary signal, which, on the basis of said measured temporal relationship, are assigned to the same temporal positions of said varying values overtime of the signal to be measured.

5. A process according to claim 4, wherein said averaging is carried out during the measuring step itself.

6. A process according ot claim 5, wherein said primary beam current only differs from zero in a time period, the position of which is determined by said trigger signal.

7. A process according to claim 6, wherein the primary corpuscles are generated by thermal emission.

8. A process according to claim 6, wherein said primary corpuscles are generated by field emission.

9. A process according to claim 6, wherein said primary corpuscles are generated by photo-emission.

10. A process according to claim 9, wherein instead of a periodic continuation of the primary beam current a phase position of said primary corpuscular current is altered during measuring.

11. A process according to claim 10, wherein said primary corpuscular current is jittered.

12. A process according to claim 11, wherein said secondary signal is derived from said sample with a detector.

13. A process according to claim 12, wherein said secondary signal is gained with a spectrometer.

14. A process according to claim 13, wherein said interaction between said primary beam and said sample is a voltage contrast effect.

15. A process according to claim 13, wherein said interaction between said primary beam and said sample is a magnetic contrast.

16. A process according to claim 13, wherein said interaction between said primary beam and said sample is an EBIC effect.

17. A process according to claim 16, wherein the duration period of said varying values over time of said signal to be measured is measured in addition to said process steps a)-d) and the results of said measurement is utilized in conjunction with said measurement of said temporal relationship between said trigger signal and said primary beam current to assign said registered values of said secondary signal to said temporal positions of said varying values over time of said signal.

18. A process according to claim 17, wherein site data identifying a local position of measurement is registered.

19. A process according to claim 18, wherein said primary beam is moved over said sample, and said site data indicates the position of said primary corpuscular beam on said sample.

20. A process according to claim 19, wherein said trigger signal is provided by a function tester.

21. A process according to claim 20, wherein said sample is an integrated circuit.

22. A system for measuring a time-domain waveform of a recurring signal at at least one site of measurement of a sample in a microscope by an instrument for guiding and focusing a primary corpuscular beam on a sample, which is supplied with supply voltages or signals by a drive unit, comprising:
- a primary beam source for generating modulated primary corpuscular beams, each said primary beam having a primary beam current;
- means for measuring the temporal relationship between a rigger signal and a time-domain waveform of the primary beam current and providing an output value; and
- a measured value processing system for registering and assessing the values of a secondary signal produced by an interaction between said primary beams and said sample and which receives said output value from said means for measuring the temporal relationship, wherein the measured value processing system assigns temporal positions of the time-domain waveform of the signal to be measured to the values of the secondary signal according to the temporal relationship between the trigger signal and the time-domain waveform of the primary beam current.

23. A system according to claim 22, wherein said primary beam source includes an electron gun for generating a modulated current of said primary corpuscles and a bam modulation system coupled to said electron gun.

24. A system according to claim 23, wherein said beam modulation system is operated in resonance.

25. A system according to claim 22, wherein said primary beam source contains an electron gun, which generates a modulated current of said primary corpuscles.

26. A system according to claim 25, wherein said electron gun contains a semi-conductor cathode, the primary corpuscular emission of which is controlled by the current through the cathode.

27. A system according to claim 25, wherein said electron gun contains a photo-cathode, which is stimulated by light pulses to emit primary corpuscular pulses.

28. A system according to claim 22, further comprising a beam modulation generator which transmits a modulation signal, by means of which a modulation of said primary beam current is brought about, to said primary beam source via a modulation input said primary beam source.

29. A system according to claim 28, wherein said beam modulation generator includes:
- a stable time base,
- a comparator, a first input of which is connected to an output of said time base,
- a pulse generator, a trigger input of which is connected to an output of comparator, and a device for alterning the response threshold of said comparator at random.

30. A system according to claim 29, wherein said device for altering said response threshold of said comparator includes a digital random number generator, a digital-analog converter coupled to said digital random number generator, the output of said digital-analog converter being connected to a second input of said comparator.

31. A system according to claim 28, wherein said beam modulation generator contains a pulse laser, said modulation signal comprises single light impulses, and said modulation input is an optical input.

32. A system according to claim 22, wherein said means for measuring said temporal relationship between said trigger signal and said time domain waveform of the primary corpuscular current includes a time intervalometer, at a first input of which said trigger signal or a signal derived therefrom is transmitted and at a second input of which said modulation signal or a signal derived therefrom is transmitted.

33. A system according to claim 32, wherein said time intervalometer is a frequency counter.

34. A system according to claim 22, wherein said measured value processing system includes:
- an analog-digital converter for digitizing the values of said secondary signal,
- a delay unit coupled to said analog-digital converter for delaying said values of said secondary signal,
- a memory unit for recording said values of said secondary signal,
- a buffer circuit coupled between said delay unit and said memory unit for transferring said values from said secondary signal to said memory unit, and
- an address counter coupled to said memory and which produces at least a part of the address signals required for addressing said memory unit.

35. A system according to claim 34, wherein said delay unit comprise a shift register.

36. A system according to claim 34, wherein said delay unit comprises a FIFO memory.

37. A system according to claim 34, wherein said delay unit comprises a CCD element.

38. A system according to claim 22 further comprising a counter, which released by said trigger signal or by a signal derived therefrom stops the transfer of said registered values of said secondary signal to said memory unit after a specific number or cycles of said modulation signal.

39. A system according to claim 34, wherein a part of said address signals required for addressing said memory is delivered by the means for determining said temporal relationship between said trigger signal or a signal derived therefrom and said primary corpuscular current.

40. A system according to claim 34, wherein said measured value processing system contains an adder which adds the pertinent values of said secondary signal to the values recorded in said memory unit.

* * * * *